(12) United States Patent
Yu et al.

(10) Patent No.: US 9,142,805 B2
(45) Date of Patent: Sep. 22, 2015

(54) METHOD OF MANUFACTURING ORGANIC LIGHT EMITTING DISPLAY PANEL

(71) Applicant: LG Display Co., Ltd., Seoul (KR)

(72) Inventors: Hui-Seong Yu, Jeonju-si (KR); Sung-Ho Lee, Daegu (KR); Hyun-Taek Lim, Busan (KR); In-Seok Kim, Gumi-si (KR); Myung-Jae Yoo, Busan (KR)

(73) Assignee: LG Display Co., Ltd., Seoul (KR)

( * ) Notice: Subject to any disclaimer, the term of this patent is extended or adjusted under 35 U.S.C. 154(b) by 153 days.

(21) Appl. No.: 13/899,464

(22) Filed: May 21, 2013

(65) Prior Publication Data

US 2013/0316475 A1 Nov. 28, 2013

(30) Foreign Application Priority Data

May 22, 2012 (KR) .................. 10-2012-0054091

(51) Int. Cl.
*H01L 51/56* (2006.01)
*H01L 51/52* (2006.01)
*H01L 27/32* (2006.01)

(52) U.S. Cl.
CPC .............. *H01L 51/56* (2013.01); *H01L 51/524* (2013.01); *H01L 27/3276* (2013.01); *H01L 51/5253* (2013.01); *H01L 2251/566* (2013.01)

(58) Field of Classification Search
CPC ... H01L 51/56; H01L 51/525; H01L 51/0001; H01L 51/0024; H01L 51/50; H01L 51/5044; H01L 51/5203; H01L 51/5237; H01L 51/524
USPC ...................... 257/E51.018, E51.02–E51.022, 257/E23.116, E23.123, E23.124, E23.127, 257/E23.129, E23.132–E23.133; 438/25–26, 34, 38, 118, 406, 455
See application file for complete search history.

(56) References Cited

U.S. PATENT DOCUMENTS 6,605,826 B2 * 8/2003 Yamazaki et al. .............. 257/72
7,700,958 B2 * 4/2010 Nishi et al. .................... 257/88
(Continued)

FOREIGN PATENT DOCUMENTS

| CN | 102420207 A | 4/2012 |
| JP | 2002-151254 A | 5/2002 |

OTHER PUBLICATIONS

Office Action for Chinese Patent Application No. CN 201310190075.6, May 4, 2015, 14 Pages.

*Primary Examiner* — Laura Menz
*Assistant Examiner* — Maliheh Malek
(74) *Attorney, Agent, or Firm* — Fenwick & West LLP

(57) ABSTRACT

A method of manufacturing an organic light emitting display panel forming a protective insulating film in a luminescent region without causing defects in a pattern is disclosed. The method of manufacturing an organic light emitting display panel includes forming a substrate having a luminescent region and a pad region, simultaneously forming a light emitting cell in the luminescent region and an organic pattern in the pad region, forming a protective insulating film over the substrate, bonding the substrate provided with the protective insulating film and the sealing substrate using an adhesive film formed in a region corresponding to the luminescent region, cutting the bonded substrate provided with the protective insulating film and the sealing substrate into a plurality of unit panels to expose the pad region, and removing the protective insulating film and the organic pattern in the exposed pad region.

12 Claims, 15 Drawing Sheets

(56) References Cited

U.S. PATENT DOCUMENTS

| | | | |
|---|---|---|---|
| 7,990,060 B2 * | 8/2011 | Ahn et al. | 313/512 |
| 7,990,061 B2 * | 8/2011 | Kim | 313/512 |
| 8,017,950 B2 * | 9/2011 | Joo | 257/72 |
| 8,274,090 B2 * | 9/2012 | Choi et al. | 257/88 |
| 8,330,712 B2 * | 12/2012 | Park et al. | 345/107 |
| 8,502,214 B2 * | 8/2013 | Kim | 257/40 |
| 8,581,234 B2 * | 11/2013 | Yamazaki et al. | 257/29 |
| 8,669,130 B2 * | 3/2014 | Nam et al. | 438/48 |
| 8,680,517 B2 * | 3/2014 | Shin et al. | 257/40 |
| 8,697,504 B2 * | 4/2014 | Bale et al. | 438/158 |
| 8,877,570 B2 * | 11/2014 | Kim et al. | 438/149 |
| 8,928,601 B2 * | 1/2015 | Lee et al. | 345/173 |
| 2002/0158568 A1 * | 10/2002 | Satake | 313/493 |
| 2002/0179908 A1 * | 12/2002 | Arao | 257/72 |
| 2003/0227253 A1 * | 12/2003 | Seo et al. | 313/504 |
| 2006/0043360 A1 * | 3/2006 | Kim et al. | 257/40 |
| 2007/0114525 A1 * | 5/2007 | Lee et al. | 257/40 |
| 2007/0134832 A1 * | 6/2007 | Oh et al. | 438/30 |
| 2007/0158656 A1 * | 7/2007 | Lee et al. | 257/72 |
| 2008/0018245 A1 * | 1/2008 | Kim et al. | 313/512 |
| 2008/0160864 A1 * | 7/2008 | Song et al. | 445/3 |
| 2008/0287028 A1 * | 11/2008 | Ozawa | 445/24 |
| 2009/0315458 A1 * | 12/2009 | Choi et al. | 313/505 |
| 2010/0066240 A1 * | 3/2010 | Park et al. | 313/504 |
| 2011/0198627 A1 * | 8/2011 | Maindron et al. | 257/88 |
| 2011/0241563 A1 * | 10/2011 | Kim et al. | 315/291 |
| 2012/0153309 A1 * | 6/2012 | Kim et al. | 257/88 |
| 2012/0190220 A1 * | 7/2012 | Lee et al. | 439/67 |
| 2012/0205631 A1 * | 8/2012 | Seo et al. | 257/40 |
| 2012/0286281 A1 * | 11/2012 | You | 257/72 |
| 2012/0286312 A1 * | 11/2012 | Hatano et al. | 257/98 |
| 2013/0009154 A1 * | 1/2013 | Choi et al. | 257/59 |
| 2013/0049003 A1 * | 2/2013 | Choi et al. | 257/72 |
| 2013/0069853 A1 * | 3/2013 | Choi | 345/80 |
| 2013/0093697 A1 * | 4/2013 | Sun | 345/173 |
| 2013/0106747 A1 * | 5/2013 | Choi et al. | 345/173 |
| 2013/0249877 A1 * | 9/2013 | Choi et al. | 345/205 |
| 2013/0300775 A1 * | 11/2013 | Choi et al. | 345/690 |
| 2013/0313530 A1 * | 11/2013 | Seo et al. | 257/40 |
| 2014/0361200 A1 * | 12/2014 | Rudmann et al. | 250/578.1 |
| 2014/0374719 A1 * | 12/2014 | Cho et al. | 257/40 |

* cited by examiner

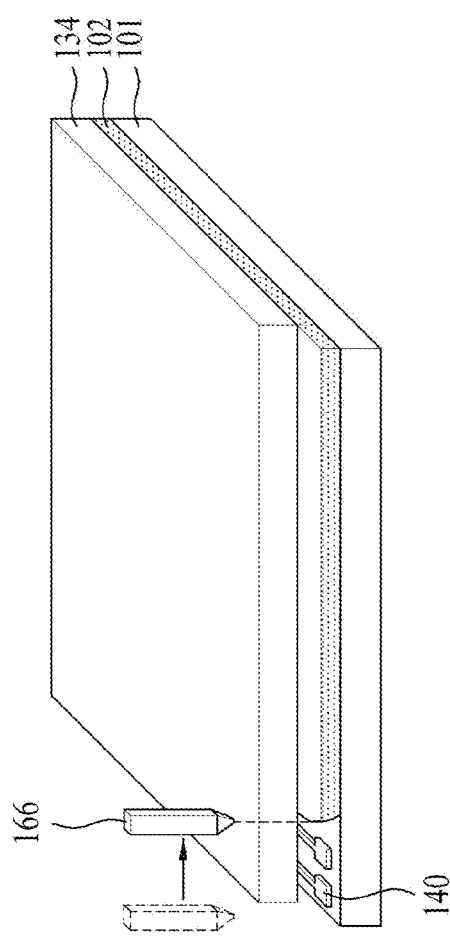
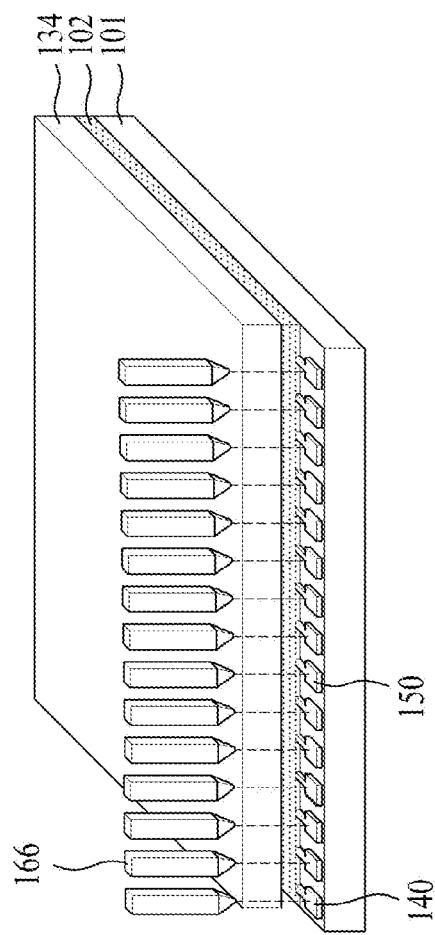
FIG. 6A
FIG. 6B

METHOD OF MANUFACTURING ORGANIC LIGHT EMITTING DISPLAY PANEL

CROSS REFERENCE TO RELATED APPLICATIONS

This application claims the benefit of Korean Patent Application No. 10-2012-0054091, filed on May 22, 2012, which is hereby incorporated by reference in its entirety.

BACKGROUND OF THE INVENTION

1. Field of the Invention

The present invention relates to a method of manufacturing an organic light emitting display panel capable of forming a protective insulating film in a luminescent region without causing defects in a pattern.

2. Discussion of the Related Art

In recent years, a variety of flat panel display devices having reduced weight and volume, which are drawbacks of cathode ray tubes (CRTs), have been introduced. Examples of flat panel display devices include liquid crystal displays (LCDs), field emission displays (FEDs), plasma display panels (PDPs), and organic electroluminescent displays (ELDs).

Among these display devices, organic electro-luminescent display is a self-emitting device having advantages such as rapid response, high luminous efficacy, high luminance, and wide viewing angle. In conventional organic electro-luminescent displays, a plurality of thin film patterns is formed on a substrate using a mask frame assembly.

A mask frame assembly includes transmission units respectively corresponding to a plurality of thin film patterns, a deposition mask having a blocking unit formed between the transmission units, and a mask frame fixing the deposition mask.

The deposition mask is damaged by plasma generated during a deposition process and deformed due to reduced strength by heat generated during the deposition process. In this regard, a deformed blocking unit of the deposition mask cannot keep the surface flat, thereby causing gaps. Thus, alignment accuracy between the deposition mask and the substrate decreases during the deposition process, resulting in deposition defects by which a thin film is deposited on a substrate corresponding to the blocking unit. Particularly, a protective insulating film that should be formed only in the luminescent region using the deposition mask may also be formed in a pad region corresponding to the blocking unit of the deposition mask due to deformation of the deposition mask.

SUMMARY OF THE INVENTION

Accordingly, the present invention is directed to a method of manufacturing an organic light emitting display device that substantially obviates one or more problems due to limitations and disadvantages of the related art.

An object of the present invention is to provide a method of manufacturing an organic light emitting display panel capable of forming a protective insulating film in a luminescent region without causing pattern defects.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing an organic light emitting display panel includes forming a substrate having a luminescent region and a pad region, simultaneously forming a light emitting cell in the luminescent region and an organic pattern in the pad region, forming a protective insulating film over the substrate, bonding the substrate provided with the protective insulating film and the sealing substrate using an adhesive film formed in a region corresponding to the luminescent region, cutting the bonded substrate provided with the protective insulating film and the sealing substrate into a plurality of unit panels to expose the pad region, and removing the protective insulating film and the organic pattern in the exposed pad region.

The forming of the light emitting cell in the luminescent region and the organic pattern may include simultaneously forming at least one of an organic light emitting layer of the light emitting cell and a bank insulating film defining the organic light emitting layer and the organic pattern using the same material. The organic pattern may be separated from the at least one of the organic light emitting layer and the bank insulating film simultaneously formed.

The removing of the protective insulating film and the organic pattern in the exposed pad region may include adhering an adhesive tape to the substrate, removing the protective insulating film disposed in the pad region and adhered to the adhesive tape by peeling off the adhesive tape, and removing the organic pattern of the pad region by immersing the entire substrate from which the protective insulating film is removed or the pad region in an etchant, which may include isopropyl alcohol. The removing of the protective insulating film and the organic pattern in the exposed pad region may further include irradiating ultrasonic waves to the pad region immersed in the etchant including isopropyl alcohol.

The removing of the protective insulating film and the organic pattern in the exposed pad region may include adhering an adhesive tape to the substrate, removing the protective insulating film disposed in the pad region and adhered to the adhesive tape by peeling off the adhesive tape, immersing the entire substrate from which the protective insulating film is removed or the pad region in deionized water, and removing the organic pattern of the pad region by irradiating ultrasonic waves to the pad region immersed in deionized water.

The removing of the protective insulating film and the organic pattern in the exposed pad region may include adhering an adhesive tape to the substrate, removing the protective insulating film disposed in the pad region and adhered to the adhesive tape by peeling off the adhesive tape, removing the protective insulating film in the pad region to which the adhesive tape is adhered by peeling-off the adhesive tape, and evaporating the organic pattern by irradiating the organic pattern of the pad region exposed by the removal of the protective insulating film. The exposed pad region may be irradiated with a laser beam.

The evaporating of the organic pattern by irradiating the organic pattern of the pad region may include evaporating the organic pattern using energy of the laser beams absorbed by pad electrodes having octagonal or circular shapes and formed in the pad region to remove the organic pattern.

The adhesive tape may be adhered to the substrate to protrude from at least one of a plurality of sides of the substrate.

The removing of the protective insulating film and the organic pattern in the exposed pad region may include immersing the entire substrate or the pad region in an etchant including isopropyl alcohol or deionized water after the cutting process, and simultaneously removing the organic pattern of the pad region by irradiating ultrasonic waves to the pad region immersed in the etchant including isopropyl alcohol or deionized water and the protective insulating film formed on the organic pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 6A and 6B are diagrams for describing another example of the method of removing the organic pattern described with reference to FIG. 2J.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
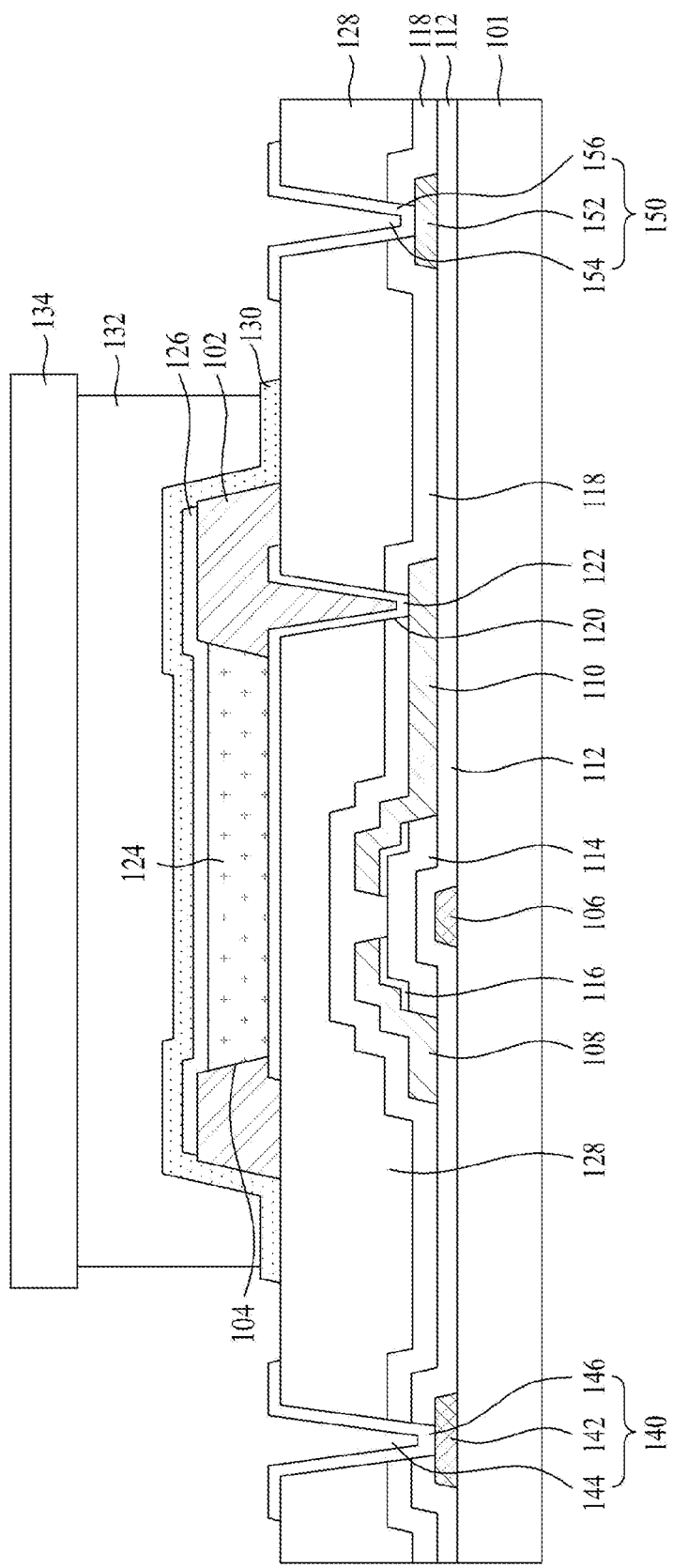
FIG. 1 is a cross-sectional view illustrating an organic light emitting display panel according to the present invention.

FIG. 1 is a cross-sectional view illustrating an organic light emitting display panel according to the present invention.

The organic light emitting display panel illustrated in FIG. 1 includes a light emitting substrate and a sealing substrate 134 adhered to the light emitting substrate via an adhesive film 132.

The light emitting substrate includes a plurality of thin film transistors formed in a luminescent region of the substrate, light emitting cells connected to the thin film transistors, and a protective insulating film 130 formed to protect the light emitting cells.

Each of the thin film transistors includes a gate electrode 106, a drain electrode 110 connected to a first electrode 122 of a light emitting cell, a source electrode 108 facing the drain electrode 110, an active layer 114 overlapping the gate electrode 106 while interposing the gate insulating layer 112 therebetween to form a channel between the source electrode 108 and the drain electrode 110, and an ohmic contact layer 116 formed on the active layer 114 except for the channel region for ohmic contact between the active layer 114 and each of the source electrode 108 and the drain electrode 110.

An inorganic passivation layer 118 formed of an inorganic insulating material and an organic passivation layer 128 formed of an organic insulating material are sequentially laminated on the thin film transistor. The organic passivation layer 128 is formed to planarize the substrate 101 provided with the thin film transistor thereon. The inorganic passivation layer 118 is formed to improve stability of interfaces between the organic passivation layer 128 and each of the gate insulating layers 112 and the source and drain electrodes 108 and 110.

The light emitting cell includes a first electrode 122 formed on the organic passivation layer 128, an organic light emitting layer 124 formed on the first electrode 122, and a second electrode 126 formed on the organic light emitting layer 124.

The organic light emitting layer 124 includes a hole-related layer, a light emitting layer, and an electron-related layer sequentially formed on the first electrode 122 or in reverse order. The organic light emitting layer 124 is formed in a bank hole 104 defined by a bank insulating film 102 that partitions each luminescent region.

The first electrode 122 is electrically connected to the drain electrode 110 of the thin film transistor via a pixel contact hole 120 that penetrates the inorganic passivation layer 118 and the organic passivation layer 128. The first electrode 122 may have its structure formed by laminating an opaque conductive material such as aluminum (Al) and a transparent conductive material such as indium tin oxide (ITO). Alternatively, the first electrode 122 may be formed of an acid-resistant and corrosion-resistant opaque metal.

The second electrode 126 is formed on the organic light emitting layer 124. The second electrode 126 is formed of a transparent conductive material such as ITO. Thus, light generated in the organic light emitting layer 124 is emitted upward through the second electrode 126.

The protective insulating film 130 is disposed between the light emitting cell and the adhesive film 132 to prevent the light emitting cell, particularly, the organic light emitting layer 124, from being damaged by moisture or oxygen or to prevent deterioration of light emitting characteristics thereof. Particularly, the protective insulating film 130 is formed to be in contact with the adhesive film 132 to block infiltration of moisture, hydrogen, and oxygen via side and front surfaces of the organic light emitting display panel. The protective insulating film 130 is formed as an inorganic insulating film using materials such as $SiN_x$, $SiO_x$, or the like.

Meanwhile, a gate pad 140 and a data pad 150 are formed in a pad region of the substrate 101 exposed by the sealing substrate 134.

The gate pad 140 is connected to a gate driving integrated circuit (IC) and a gate line to provide a driving signal from the gate driving IC to the gate line. To this end, the gate pad 140 includes a gate pad lower electrode 142 extending from the gate line and a gate pad upper electrode 146 disposed on the gate pad lower electrode 142 and connected to the gate pad lower electrode 142. In this regard, the gate pad upper electrode 146 is connected to the gate pad lower electrode 142 via a gate contact hole 144 that penetrates the gate insulating film 112, the inorganic passivation film 118, and the organic passivation film 128.

The data pad 150 is connected to a data driving IC and a data line to provide a driving signal from the data driving IC to the data line. To this end, the data pad 150 includes a data pad lower electrode 152 extending from the data line and a data pad upper electrode 156 disposed on the data pad lower electrode 152 and connected to the data pad lower electrode 152. In this regard, the data pad upper electrode 156 is connected to the data pad lower electrode 152 via a data contact hole 154 that penetrates the organic passivation film 128 and the inorganic passivation film 118.

The sealing substrate 134 is bonded to the light emitting substrate provided with the thin film transistor, the light emitting cell, and the protective insulating film 130 via the adhesive film 132, which may be disposed on the bottom surface of the sealing substrate 134 or the top surface of the protective insulating film 130 to seal the light emitting cell. Accordingly, the sealing substrate 134 forms a seal that prevents external moisture or oxygen from entering the light emitting substrate. In addition, since the adhesive film 132 is disposed between the bottom surface of the sealing substrate 134 and the top surface of the protective insulating film 130 that protects the organic light emitting layer 124, the space between the light emitting substrate and the sealing substrate 134 is filled with the adhesive film 132. Accordingly, the adhesive film 132 absorbs external impact, resulting in improved rigidity of the organic light emitting display panel according to the present invention.

FIGS. 2A to 2J are cross-sectional views for describing a method of manufacturing the organic light emitting display panel of FIG. 1.

Figure 2A:
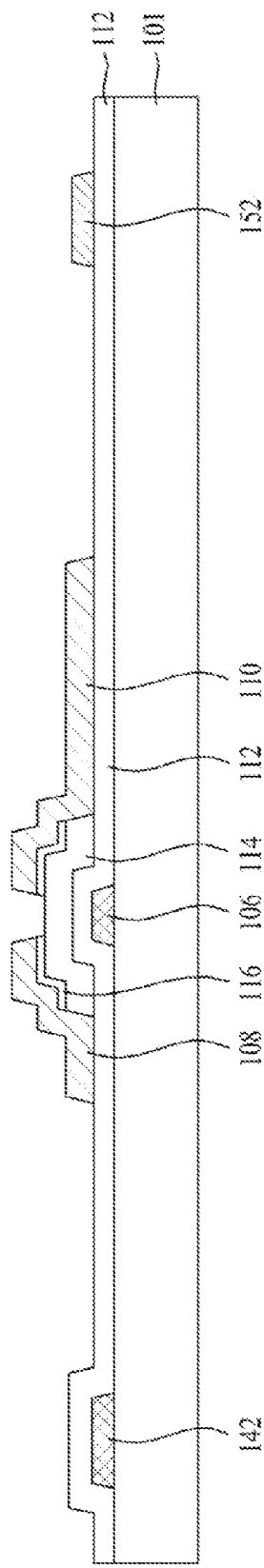
FIGS. 2A to 2J are cross-sectional views for describing a method of manufacturing the organic light emitting display panel of FIG. 1.

Referring to FIG. 2A, a gate pattern including the gate electrode 106 and the gate pad lower electrode 142, the gate insulating film 112, semiconductor patterns 114 and 116, and a data pattern including the source and drain electrodes 108 and 110 and the data pad lower electrode 152 are sequentially formed on the substrate 101.

Particularly, a gate metal layer is formed on the substrate 101 by a deposition method such as sputtering. In this regard, the gate metal layer is formed using a metal such as an aluminum-based metal (Al and AlNd), copper (Cu), titanium (Ti), molybdenum (Mo), and tungsten (W). Then, the gate metal layer is patterned by photolithography and etching to form the gate pattern including the gate electrode 106 and the gate pad lower electrode 142.

Then, an inorganic insulating material such as silicon oxide ($SiO_x$) or silicon nitride ($SiN_x$) may be formed over the substrate 101 provided with the gate pattern to form the gate insulating film 112. Then, an amorphous silicon layer and an amorphous silicon layer doped with an impurity ($n^+$ or $p^+$) are sequentially formed on the substrate 101 provided with the gate insulating film 112. Then, the amorphous silicon layer and the amorphous silicon layer doped with an impurity ($n^-$ or $p^+$) are patterned by photolithography and etching to form the semiconductor patterns including the active layer 114 and the ohmic contact layer 116.

Then, a data metal layer is formed on the substrate 101 provided with the semiconductor patterns by deposition such as sputtering. In this regard, the data metal layer may be formed of titanium (Ti), tungsten (W), an aluminum (Al)-based metal, molybdenum (Mo), copper (Cu), or the like. Then, the data metal layer is patterned by photolithography and etching to form the data pattern including the source and drain electrodes 108 and 110 and the data pad lower electrode 152. Then, a portion of the ohmic contact layer 116 disposed between the source electrode 108 and the drain electrode 110 is removed using the source electrode 108 and the drain electrode 110 as masks to expose the active layer 114.

Since the semiconductor patterns 114 and 116 and the data pattern are independently formed as described above, two masks are required therefor. Besides, the semiconductor patterns 114 and 116 and the data pattern may be formed by use of a diffraction mask or semi-transmissive mask or via a single mask process using a diffraction mask, i.e., may be simultaneously formed.

Figure 2B:
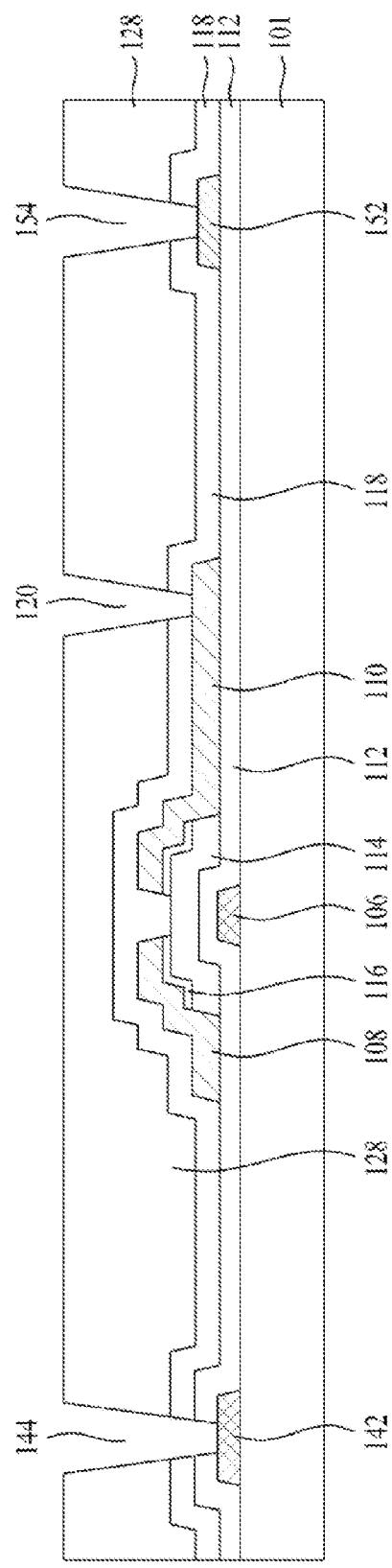

Referring to FIG. 2B, the inorganic passivation film 118 and the organic passivation film 128 having the pixel contact hole 120, the gate contact hole 144, and the data contact hole 154 are formed on the substrate 101 provided with the data pattern.

Particularly, the inorganic passivation film 118 is formed by applying an inorganic insulating material such as silicon oxide ($SiO_x$) or silicon nitride ($SiN_x$) over the substrate 101 provided with the data pattern. Then, the organic passivation film 128 is formed by applying an organic insulating material such as an acrylic resin over the inorganic passivation film 118. Then, the inorganic passivation film 118 and the organic passivation film 128 are patterned by photolithography and etching to form the pixel contact hole 120, the gate contact hole 144, and the data contact hole 154. The pixel contact hole 120 penetrates the inorganic passivation film 118 and the organic passivation film 128 to expose the drain electrode 110. The data contact hole 154 penetrates the inorganic passivation film 118 and the organic passivation film 128 to expose the data pad lower electrode 152. The gate contact hole 144 penetrates the gate insulating film 112, the inorganic passivation film 118, and the organic passivation film 128 to expose the gate pad lower electrode 142.

Figure 2C:
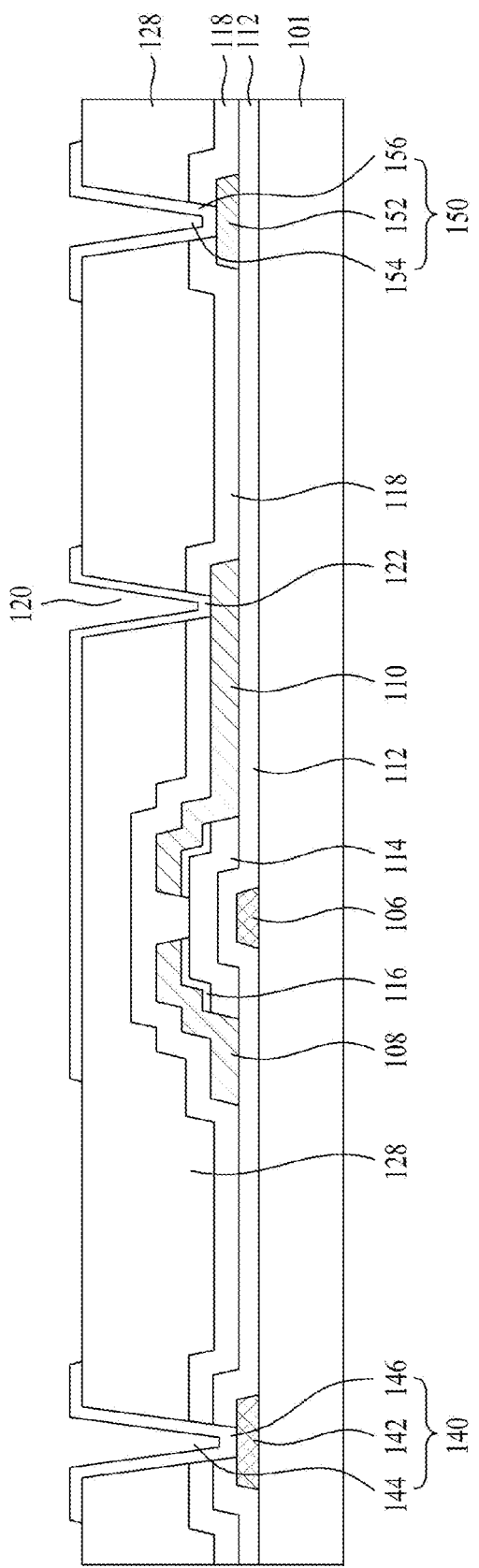

Referring to FIG. 2C, the first electrode 122, the gate pad upper electrode 146, and the data pad upper electrode 156 are formed on the substrate 101 provided with the organic passivation film 128 with the respective holes.

Particularly, an opaque conductive layer having high reflectivity and high acid-resistance or a stack structure including an opaque conductive layer having high reflectivity and a transparent conductive layer having high acid-resistance may be formed on the substrate 101 provided with the organic passivation film 128 by deposition such as sputtering. Then, the conductive layers are patterned by photolithography and etching to form the first electrode 122, the gate pad upper electrode 146, and the data pad upper electrode 156.

Figure 2D:
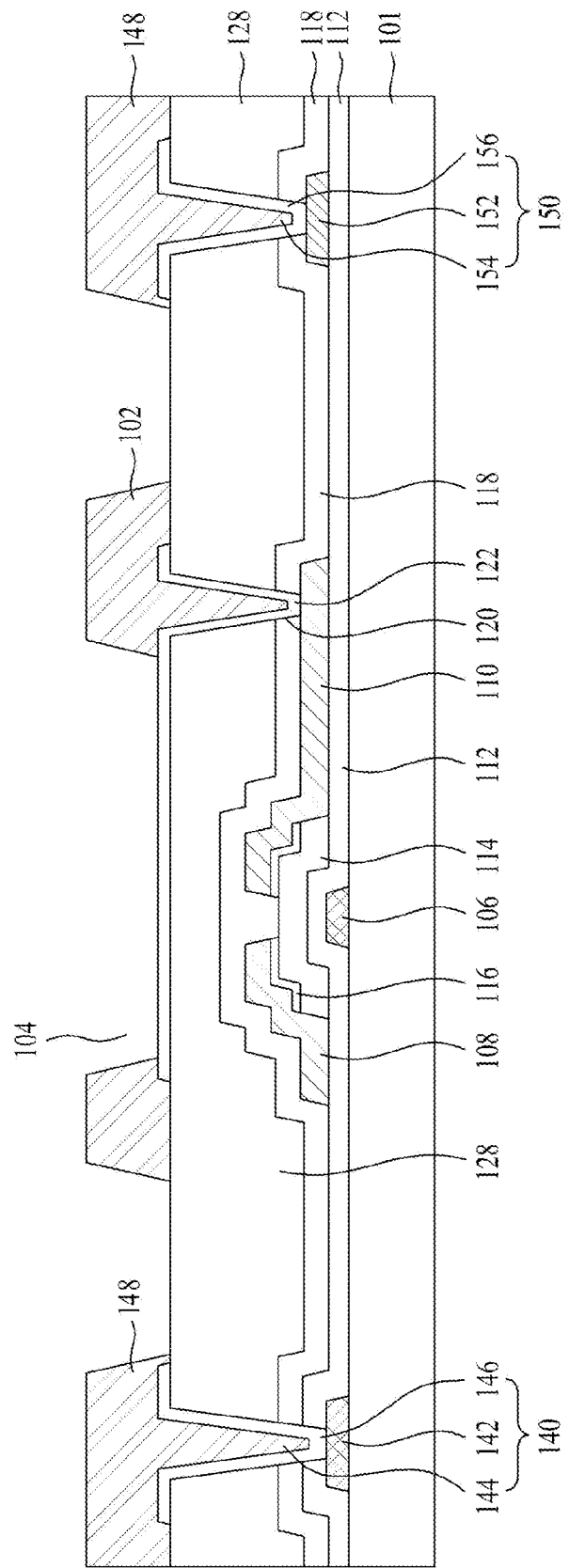

Referring to FIG. 2D, the bank insulating film 102 having the bank hole 104 is formed on the substrate 101 provided with the first electrode 122. Simultaneously, an organic pattern 148 may be formed on the gate pad 140 and the data pad 150.

Particularly, the bank insulating film 102 having the bank hole 104 and the organic pattern 148 are simultaneously formed by forming an organic insulating material such as an acrylic resin over the substrate 101 provided with the first electrode 122 and patterning the organic insulating material by photolithography and etching or by photolithography only. The bank hole 104 penetrates the bank insulating film 102 of each pixel region to expose the first electrode 122. The bank insulating film 102 is formed to define light emitting cells realizing different colors. The organic pattern 148 is formed to cover the gate pad upper electrode 146 and the data pad upper electrode 156. In this regard, the bank insulating film 102 formed in the luminescent region is isolated from the organic pattern 148 formed to cover the gate pad upper electrode 146 and the data pad upper electrode 156.

Figure 2E:
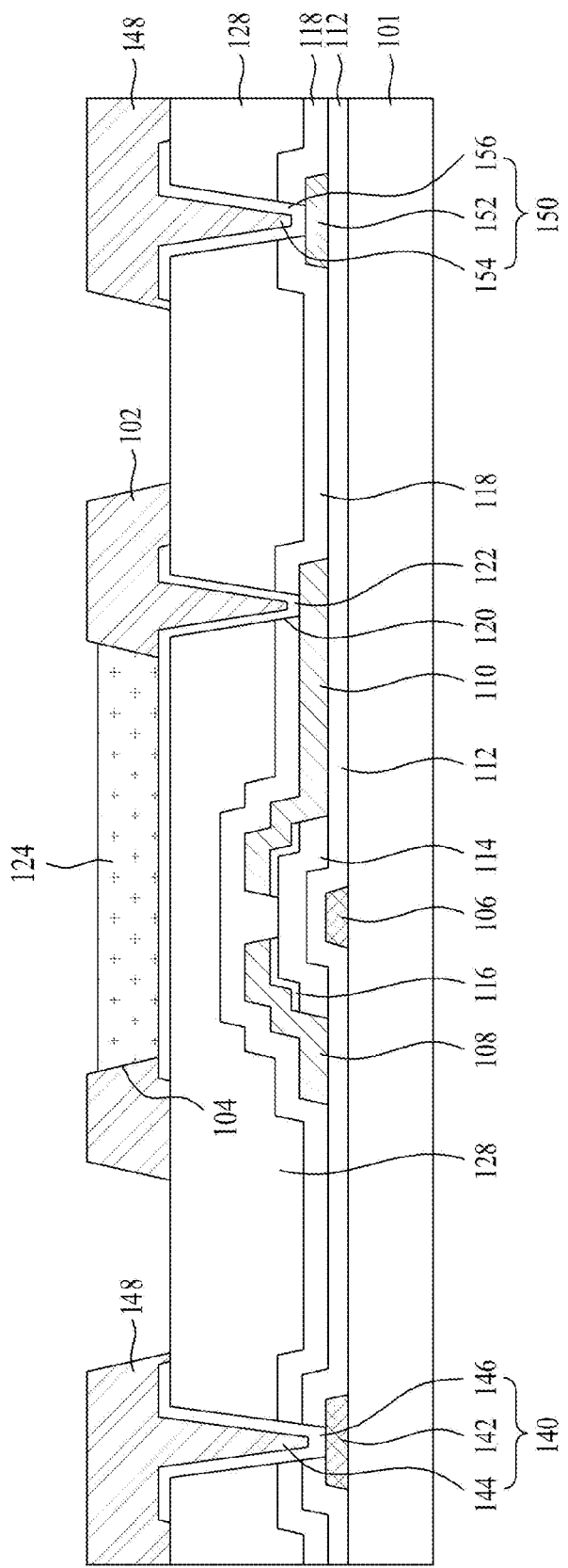

Referring to FIG. 2E, the organic light emitting layer 124 is formed on the substrate 101 provided with the bank insulating film 102 and the organic pattern 148.

Particularly, the organic light emitting layer 124 including the electron-related layer, the light emitting layer, and the hole-related layer is formed on the portion of the first electrode 122 exposed by the hole 104 within the bank insulating film 102 by thermal deposition, sputtering, or any combination thereof.

Figure 2F:
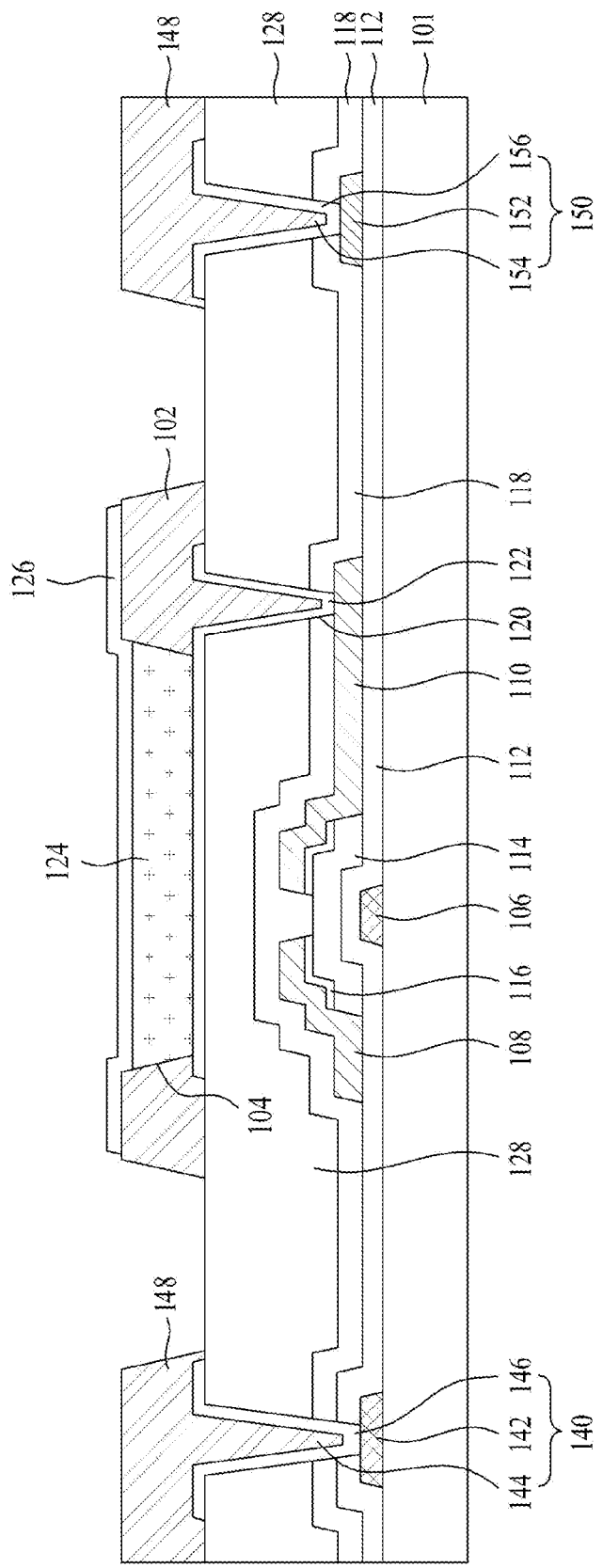

Referring to FIG. 2F, the second electrode 126 is formed on the substrate 101 provided with the organic light emitting layer 124.

Particularly, the second electrode 126 is formed by coating the substrate 101 provided with the organic light emitting layer 124 with a transparent conductive film. The transparent conductive film may be formed of indium tin oxide (ITO), tin oxide (TO), indium zinc oxide (IZO), $SnO_2$, amorphous-indium tin oxide (a-ITO), or the like.

Figure 2G:
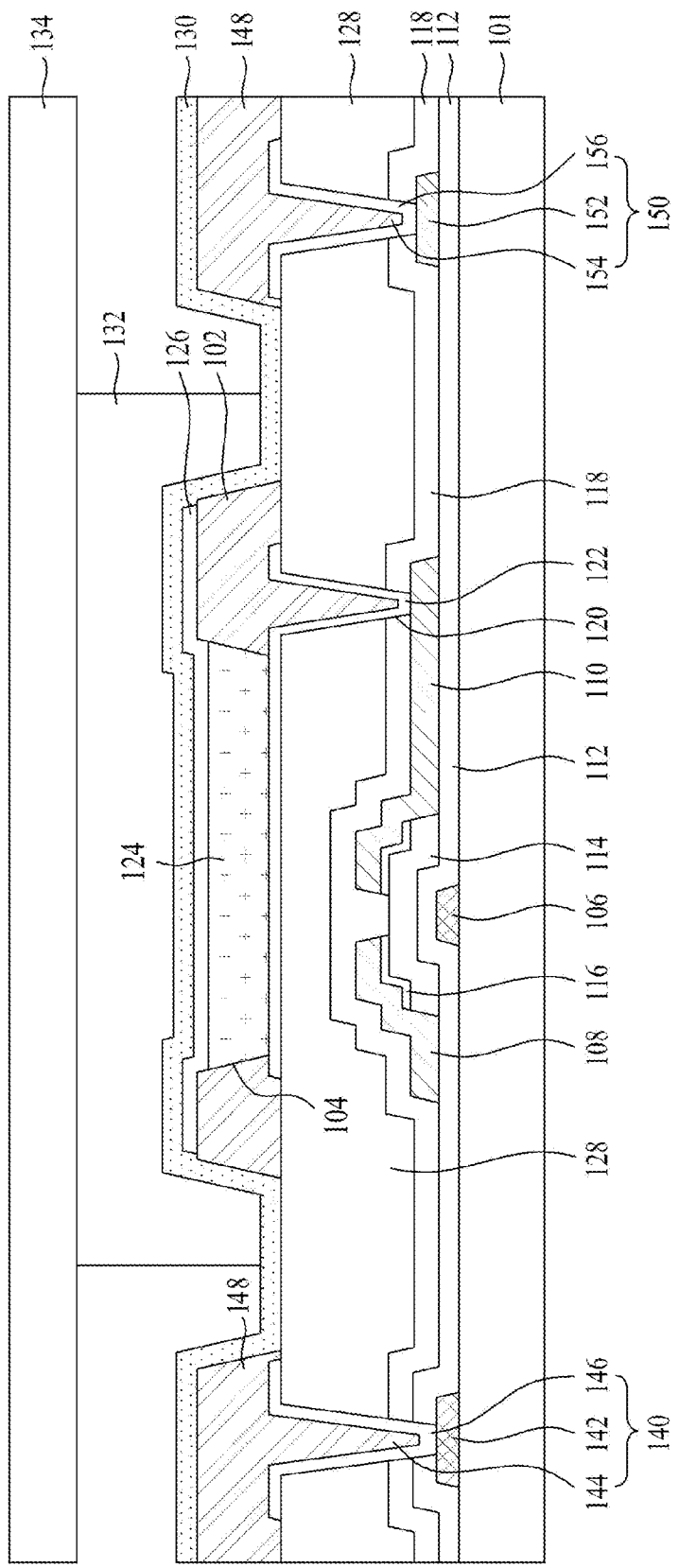

Referring to FIG. 2G, the protective insulating film 130 is formed over the substrate 101 provided with the second electrode 126 by depositing silicon oxide or silicon nitride over the entire surface thereof. In this regard, the protective insulating film 130 is deposited over the entire surface of the substrate 101 without using a deposition mask. Thus, the protective insulating film 130 is formed on the pad region including the gate pad 140 and the data pad 150 as well as the luminescent region. Then, the adhesive film 132 is applied to the top surface of the protective insulating film 130 or the bottom surface of the sealing substrate 134. As shown, the adhesive film 132 may be disposed such that it substantially covers the luminescent region including the banks 102. Accordingly, the light emitting substrate provided with the light emitting cell is bonded to the sealing substrate 134 via the adhesive film 132.

Figure 2H:
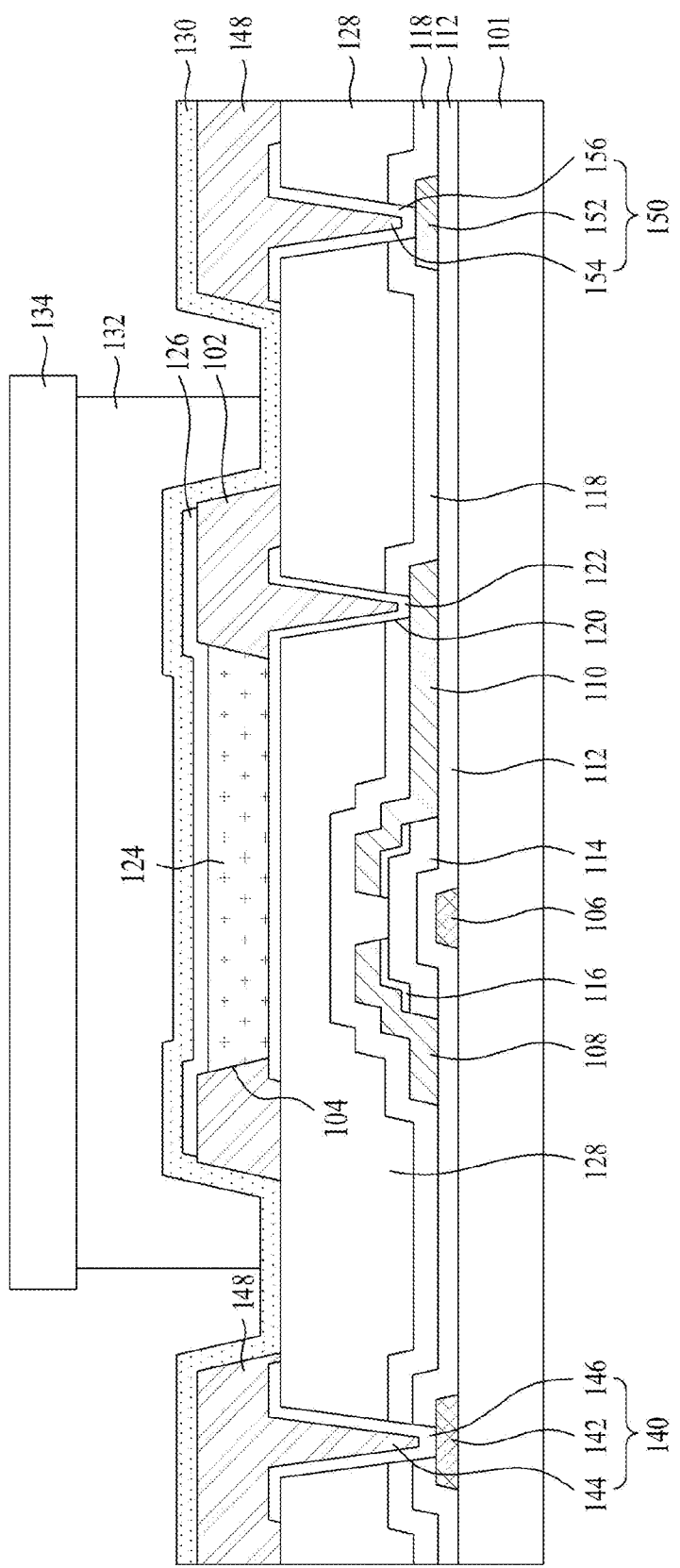

Referring to FIG. 2H, the sealing substrate 134 and the light emitting substrate bonded to each other are divided into a plurality of light emitting panels. Particularly, the sealing substrate 134 and the light emitting substrate bonded to each other are cut along scribe lines into a plurality of light emitting panels. After the cutting process, the pad region including the gate pad 140 and the data pad 150 of each of the light emitting panels is exposed to the outside by the sealing substrate 134.

Figure 2I:
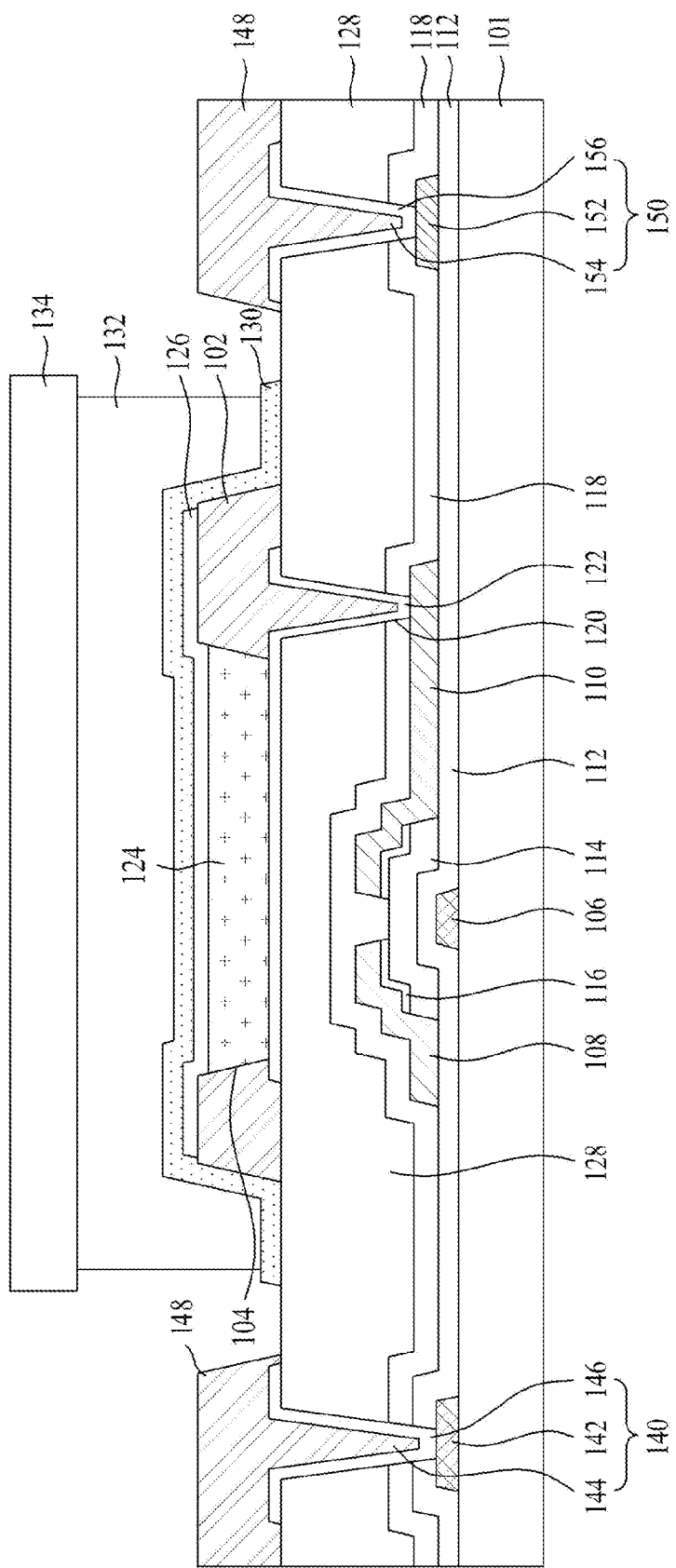
Figure 3A:
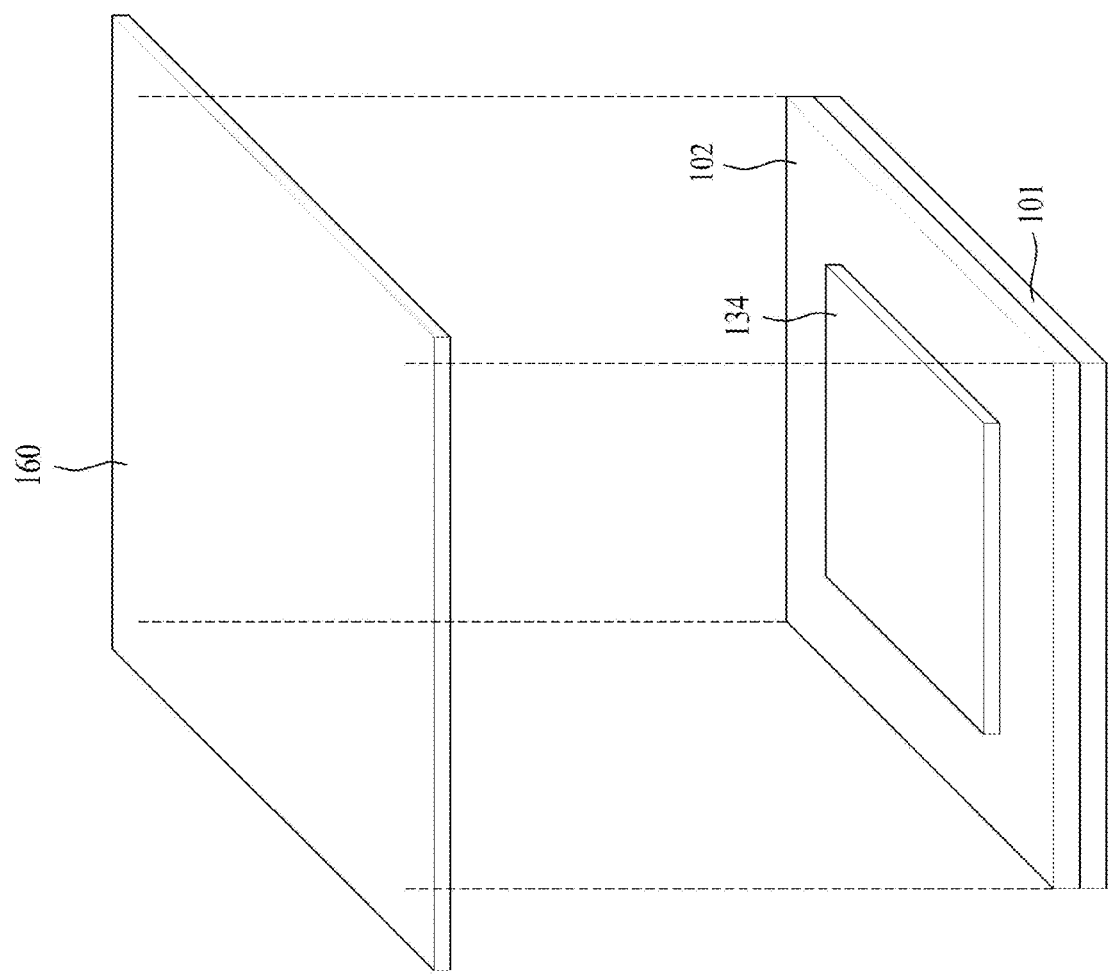
FIGS. 3A and 3B are perspective views illustrating examples of adhesive films used in a peel-off process of removing a protective insulating film described with reference to FIG. 2I.
Figure 3B:
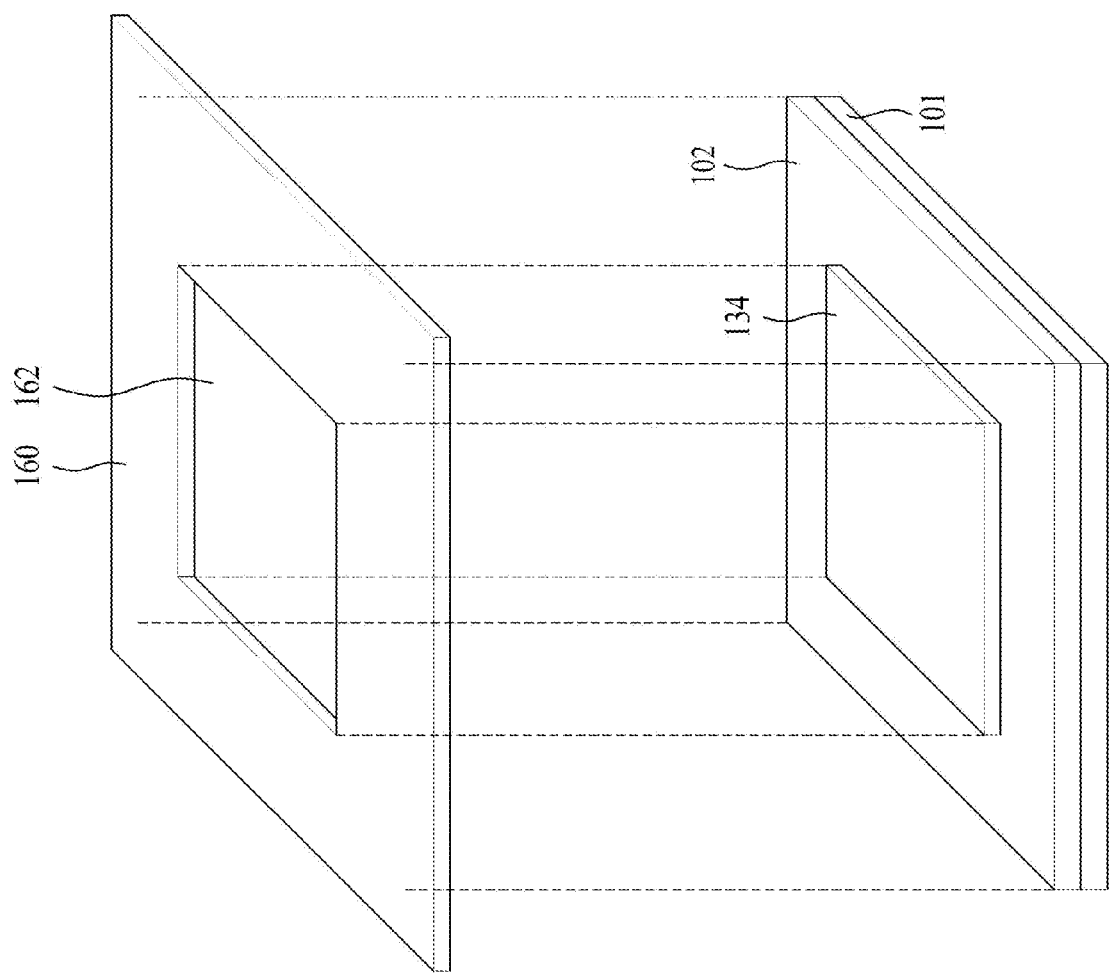

Referring to FIG. 2I, a portion of the protective insulating film 130 where the gate pad 140 and the data pad 150 are disposed is removed by a peel-off process. Particularly, an adhesive tape 160 is attached to the substrate 101 to cover the protective insulating film 130 formed in the pad region and exposed by removing the corresponding sealing substrate 134 as illustrated in FIGS. 3A and 3B. In this regard, the adhesive tape 160 illustrated in FIG. 3A covers the bonded sealing substrate 134 and the substrate 101 provided with the light emitting cell and has a greater area than the substrate 101 provided with the light emitting cell. The adhesive tape 160 illustrated in FIG. 3B has an opening 162 that exposes the sealing substrate 134 and has a greater area than the substrate 101 exposed by the sealing substrate 134. The adhesive tapes 160 of FIGS. 3A and 3B include a base film formed of polyethylene terephthalate (PET) or polyimide and an adhesive layer formed on the base film using at least one of silicone and acryl and has a peel strength of 50 fg/in or greater. In addition, the adhesive tapes 160 illustrated in FIGS. 3A and 3B have greater areas than the substrate 101 provided with the light emitting cell to protrude from at least one of the sides of the substrate 101 provided with the light emitting cell. Thus, the protruded portion of the adhesive tape 160 may be used to initiate the peel-off process, thereby facilitating the peel-off process.

During the peel-off process of the adhesive tape 160, the protective insulating film 130 bonded to the adhesive tape 160 is separated from the organic pattern 148. In this regard, the adhesive force between the protective insulating film 130 formed of an inorganic insulating material and the organic pattern 148 formed of an organic insulating material is lower than the adhesive force between the organic passivation film 128 provided with the gate pad upper electrode 146 and the data pad upper electrode 156 and the organic pattern 148, so that only the protective insulating film 130 is removed in the peel-off process.

Figure 2J:
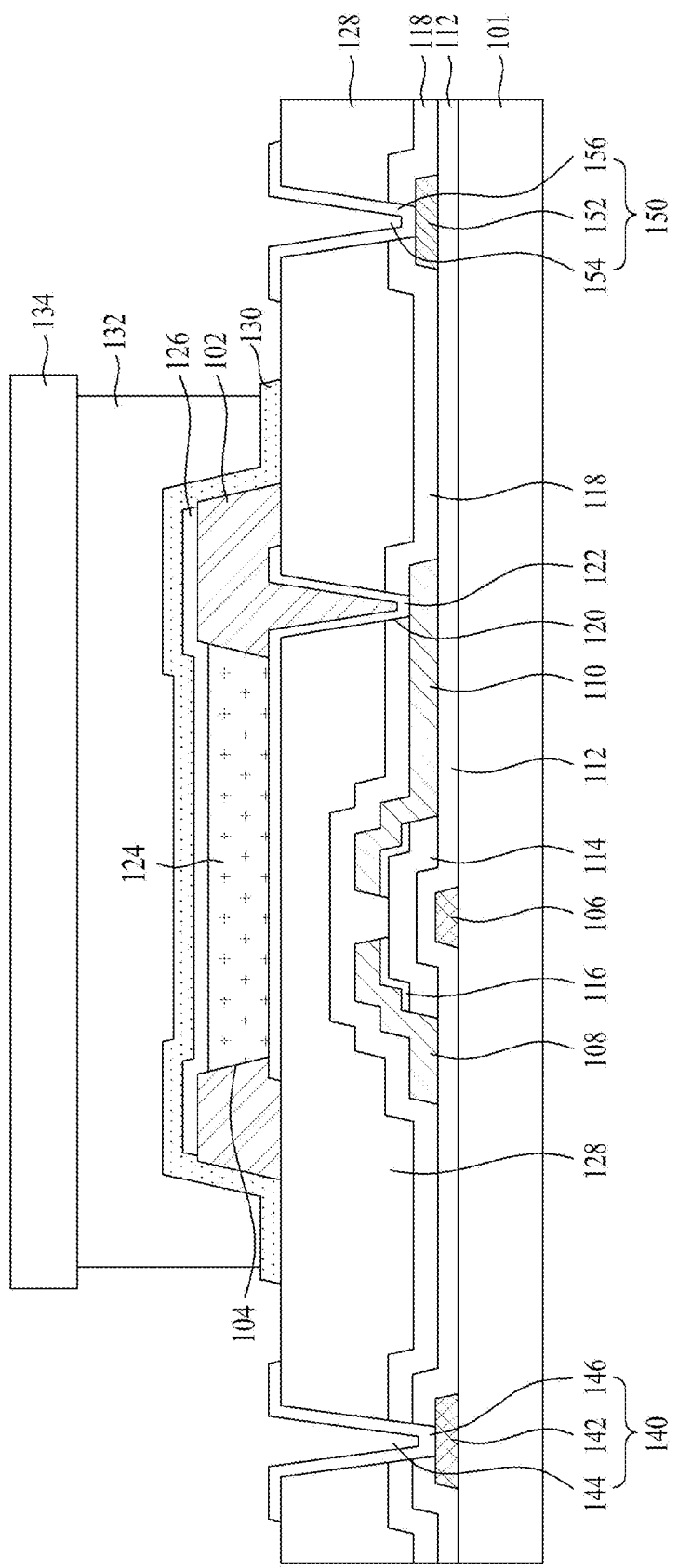

Referring to FIG. 2J, the organic pattern 148 disposed on the gate pad 140 and the data pad 150 is removed by one of the processes illustrated in FIGS. 4A to 6B to expose the gate pad 140 and the data pad 150.

Figure 4A:
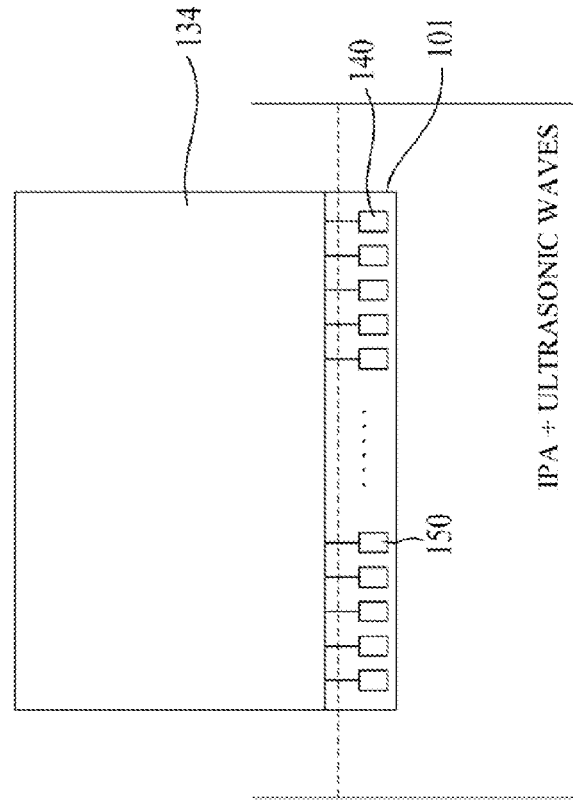
FIGS. 4A and 4B are diagrams for describing an example of a method of removing an organic pattern described with reference to FIG. 2J.
Figure 4B:
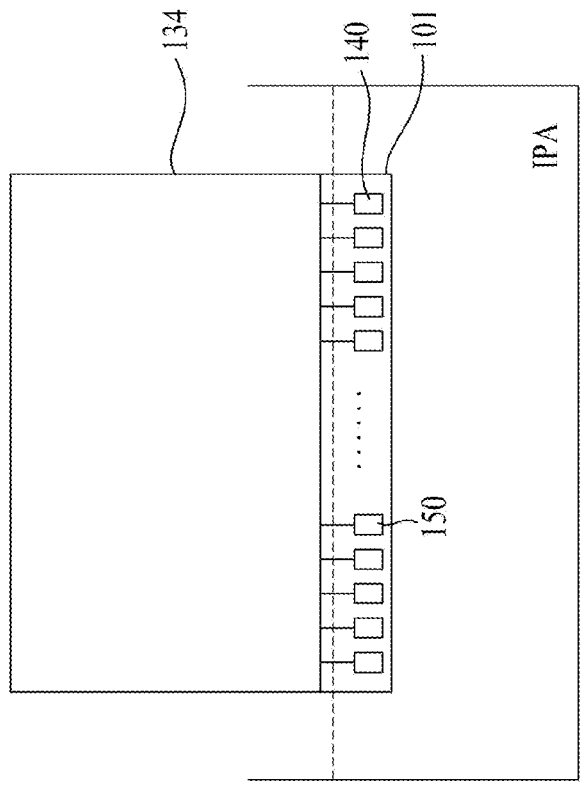

Particularly, as illustrated in FIG. 4A, the pad region in which the gate pad 140 and the data pad 150 are formed or the entire organic light emitting display panel is immersed in an etchant for several to several tens of minutes, for example, for 6 to 15 minutes. In this regard, the etchant may be a solution including isopropyl alcohol (IPA). Accordingly, the organic pattern 148 disposed on the gate pad 140 and the data pad 150 is removed by etching using the sealing substrate 134 as a mask and the etchant, thereby exposing the gate pad upper electrode 146 and the data pad upper electrode 156. Meanwhile, in addition to the method of removing the organic pattern 148 by use of the etchant, the organic pattern 148 may also be removed by immersing the pad region in an etchant and treating the pad region with ultrasonic waves at 40 kHz to 50 kHz and 50 W to 60 W to reduce processing time as illustrated in FIG. 4B.

Figure 5:
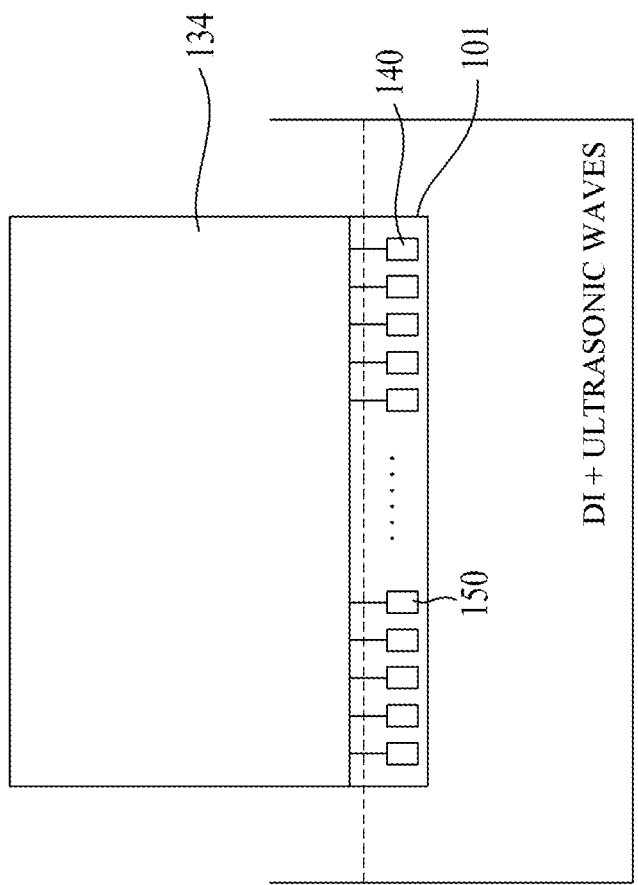
FIG. 5 is a diagram for describing another example of the method of removing the organic pattern described with reference to FIG. 2J.

Alternatively, as illustrated in FIG. 5, only the pad region including the gate pad 140 and the data pad 150 is immersed in deionized water (DI), or the entire organic light emitting display panel in which the sealing substrate and the light emitting substrate are bonded to each other is immersed in deionized water. Then, the pad region immersed in deionized water is treated with ultrasonic waves at 40 kHz to 50 kHz and 50 W to 60 W, so that the organic pattern 148 disposed on the gate pad 140 and the data pad 150 may be separated from the gate pad upper electrode 146 and the data pad upper electrode 156. Meanwhile, the process of removing the organic pattern 148 using deionized water and ultrasonic waves is less harmful to the atmospheric environment and workers than the process of removing the organic pattern 148 using IPA as illustrated in FIG. 4A.

Meanwhile, when the pad region including the gate pad 140 and the data pad 150 is immersed in the etchant including IPA or deionized water and treated with ultrasonic waves after the cutting process illustrated in FIG. 2H, the organic pattern 148 is removed from the gate pad upper electrode 146 and the data pad upper electrode 156, so that the protective insulating film 130 formed on the organic pattern 148 may also be removed. Accordingly, the protective insulating film 130 and the organic pattern 148 disposed on the gate pad 140 and the data pad 150 may be simultaneously removed using the etchant or deionized water and ultrasonic waves without performing the peel-off process for removing the protective insulating film 130 disposed on the gate pad 140 and the data pad 150.

Alternatively, the organic pattern 148 disposed in the pad region exposed by the sealing substrate 134 is removed by irradiation, for example sequentially using a short wavelength diode laser irradiation device 166 illustrated in FIG. 6A or by batch irradiation of laser beams using a laser irradiation device 166 illustrated in FIG. 6B. Particularly, short wavelength linear laser beams or short wavelength spot laser beams are irradiated to the gate pad 140 of the pad region, energy of the laser beams is partially absorbed by the opaque material since at least one of the gate pad lower electrode 142 and the gate pad upper electrode 146 disposed under the organic pattern 148 is formed of an opaque material. Thus, the organic pattern 148 formed of an organic material and disposed on the gate pad upper electrode 146 is evaporated by the absorbed energy and removed. In the same manner, when laser beams are irradiated to the data pad 150 of the pad region, energy of the laser beams is partially absorbed by the opaque material since at least one of the data pad lower electrode 152 and the data pad upper electrode 156 disposed under the organic pattern 148 is formed of an opaque material. Accordingly, the organic pattern 148 formed of an organic material and disposed on the data pad upper electrode 156 is evaporated by the absorbed energy and removed.

Meanwhile, when the organic pattern 148 is removed by the laser irradiation device 166, laser beams are irradiated to regions of the organic pattern 148 corresponding to the centers of the pad electrodes 142, 152, 146, and 156. In this case, while portions of the organic pattern 148 formed on the central regions of the pad electrodes 142, 152, 146, and 156, each having a rectangular surface area, are easily removed, portions of the organic pattern 148 formed on corners of each of the pad electrodes 142, 152, 146, and 156 farthest from the centers of the pad electrodes 142, 152, 146, and 156 are not easily removed. In order to overcome this problem, the corners of each of the pad electrodes 142, 152, 146, and 156 are rounded to form octagonal or circular shapes such that the distance between the center and a circumferential position of each of the pad electrodes 142, 152, 146, and 156 may be identical or similar to each other. As a result, since each of the pad electrodes 142, 152, 146, and 156 having an octagonal or circular shape has a uniform distance between the center and each of the sides or corners, laser beams are uniformly irradiated to the entire area of each of the pad electrodes 142, 152, 146, and 156. Thus, the organic pattern 148 disposed on each of the pad electrodes 142, 152, 146, and 156 is completely removed.

Meanwhile, since a melting point of the organic pattern 148 is lower than melting points of the gate insulating film 112 and the inorganic passivation film 118, which are formed of an inorganic insulating material, and melting points of the pad electrodes 142, 152, 146, and 156, the organic pattern 148 may be removed without damaging the gate insulating film 112, the inorganic passivation film 118, and the pad electrodes 142, 152, 146, and 156 during laser irradiation.

Meanwhile, the organic pattern 148 and the bank insulating film 102 are simultaneously formed of the same material according to the illustrated embodiment. However, the organic pattern 148 may be simultaneously formed of the same material as that of at least one organic light emitting layer 124 among an organic light emitting layer realizing red light, an organic light emitting layer green light, and an organic light emitting layer realizing blue light.

According to the present invention, after an organic pattern 148 is formed in a pad region (e.g., 140, 150), and a protective insulating film 130 is deposited over the entire surface, the protective insulating film 130 and the organic pattern 148 are removed. Depending on the embodiment, the insulating film 130 and the organic pattern 148 may be sequentially or simultaneously removed. Accordingly, since the protective insulating film 130 according to the present invention may be formed without using a deposition mask, the protective insulating film 130 may be formed in the luminescent region (e.g., 124) without causing defects associated with using the deposition mask. In addition, since the protective insulating film 130 is formed without using the deposition mask, a mask stocker, a vision aligner, and a mask frame, which are typically essential equipment for applying a protective film using the deposition mask, are not required, thereby reducing the manufacturing costs.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display panel, the method comprising:
   forming a substrate having a luminescent region and a pad region;
   forming a light emitting cell in the luminescent region and an organic pattern in the pad region;
   forming a protective insulating film over the luminescent region and the pad region of the substrate;
   bonding the substrate provided with the protective insulating film and a sealing substrate using an adhesive film formed in a region corresponding to the luminescent region;
   cutting the bonded substrate provided with the protective insulating film and the sealing substrate into a plurality of unit panels to expose the pad region; and
   subsequent to exposing the pad region, removing the protective insulating film and the organic pattern in the exposed pad region.

2. The method according to claim 1, wherein the forming of the light emitting cell and the organic pattern comprises simultaneously forming the organic pattern and at least one of an organic light emitting layer of the light emitting cell and a bank insulating film defining the organic light emitting layer using the same material, wherein the organic pattern is separated from the at least one of the simultaneously formed organic light emitting layer and bank insulating film.

3. The method according to claim 1, wherein the removing of the protective insulating film and the organic pattern in the exposed pad region comprises:
   adhering an adhesive tape to the substrate;
   removing the protective insulating film disposed in the pad region and adhered to the adhesive tape by peeling off the adhesive tape; and
   removing the organic pattern of the pad region by immersing the entire substrate from which the protective insulating film is removed or the pad region in an etchant.

4. The method according to claim 3, wherein the removing of the protective insulating film and the organic pattern in the exposed pad region further comprises irradiating ultrasonic waves to the pad region immersed in the etchant, the etchant comprising isopropyl alcohol.

5. The method according to claim 1, wherein the removing of the protective insulating film and the organic pattern in the exposed pad region comprises:
   adhering an adhesive tape to the substrate;
   removing the protective insulating film disposed in the pad region and adhered to the adhesive tape by peeling off the adhesive tape;
   immersing the entire substrate from which the protective insulating film is removed or the pad region in deionized water; and
   removing the organic pattern of the pad region by irradiating ultrasonic waves to the pad region immersed in deionized water.

6. The method according to claim 1, wherein the removing of the protective insulating film and the organic pattern in the exposed pad region comprises:
   adhering an adhesive tape to the substrate;

removing the protective insulating film disposed in the pad region and adhered to the adhesive tape by peeling off the adhesive tape;

removing the protective insulating film in the pad region to which the adhesive tape is adhered by peeling-off the adhesive tape; and evaporating the organic pattern by irradiating laser beams to the organic pattern of the pad region exposed by removal of the protective insulating film.

7. The method according to claim 6, wherein the evaporating of the organic pattern by irradiating laser beams to the organic pattern of the pad region comprises evaporating the organic pattern using energy of the laser beams absorbed by pad electrodes having octagonal or circular shapes and formed in the pad region to remove the organic pattern.

8. The method according to claim 3, wherein the adhesive tape is adhered to the substrate to protrude from at least one of a plurality of sides of the substrate.

9. The method according to claim 5, wherein the adhesive tape is adhered to the substrate to protrude from at least one of a plurality of sides of the substrate.

10. The method according to claim 6, wherein the adhesive tape is adhered to the substrate to protrude from at least one of a plurality of sides of the substrate.

11. The method according to claim 1, wherein the removing of the protective insulating film and the organic pattern in the exposed pad region comprises:

immersing the entire substrate or the pad region in an etchant comprising isopropyl alcohol or deionized water after the cutting process; and simultaneously removing the organic pattern of the pad region by irradiating ultrasonic waves to the pad region immersed in the etchant comprising isopropyl alcohol or deionized water and the protective insulating film formed on the organic pattern.

12. A method of manufacturing an organic light emitting display panel, the method comprising:

forming a substrate having a luminescent region and a pad region;

simultaneously forming an organic pattern in the pad region and at least one of an organic light emitting layer of a light emitting cell and a bank insulating film in the luminescent region, the bank insulating film defining the organic light emitting layer;

forming a protective insulating film over the luminescent region and the pad region of the substrate;

bonding the substrate provided with the protective insulating film and a sealing substrate using an adhesive film formed in a region corresponding to the luminescent region;

cutting the bonded substrate provided with the protective insulating film and the sealing substrate into a plurality of unit panels to expose the pad region; and subsequent to exposing the pad region, removing the protective insulating film and the organic pattern in the exposed pad region.

\* \* \* \* \*